United States Patent
Kawamura

(10) Patent No.: US 7,965,143 B2
(45) Date of Patent: Jun. 21, 2011

(54) DIGITAL PHASE DETECTOR AND PHASE-LOCKED LOOP

(75) Inventor: Kenji Kawamura, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 63 days.

(21) Appl. No.: 12/468,483

(22) Filed: May 19, 2009

(65) Prior Publication Data

US 2009/0289730 A1    Nov. 26, 2009

(30) Foreign Application Priority Data

May 20, 2008   (JP) .................................. 2008-131751

(51) Int. Cl.
*H03L 7/089*   (2006.01)
(52) U.S. Cl. ............................... 331/1 A; 331/25; 327/12
(58) Field of Classification Search ............... 331/1 A, 331/25; 327/12
See application file for complete search history.

(56) References Cited

U.S. PATENT DOCUMENTS

| 6,429,693 | B1 | 8/2002 | Staszewski et al. | |
| 7,304,510 | B2 | 12/2007 | Matsuta | |
| 7,482,880 | B2 * | 1/2009 | Herrin et al. | 331/1 A |
| 7,548,123 | B2 * | 6/2009 | Frey | 331/16 |
| 2006/0214708 | A1 * | 9/2006 | Huang et al. | 327/156 |
| 2007/0008040 | A1 * | 1/2007 | Mayer et al. | 331/1 A |

FOREIGN PATENT DOCUMENTS

| JP | 2002-076886 | 3/2002 |
| JP | 2007-110370 | 4/2007 |

* cited by examiner

*Primary Examiner* — Joseph Chang
(74) *Attorney, Agent, or Firm* — McDermott Will & Emery LLP

(57) ABSTRACT

A digital phase detector is provided that can be easily implemented in gate array or FPGA, to accurately quantize a phase difference of two clocks and convert to a digital value without using delay elements. The digital phase detector includes: a multiplier for, when two clocks have frequencies close to an integer ratio, receiving a first clock and multiplying by M/N; F/F for latching a second clock by an output clock of the multiplier; a differential circuit for differentiating an output of the F/F; a counter for receiving the output clock of the multiplier; a latch circuit for holding an output of the counter according to an output of the differential circuit; a first adder for adding an output of the latch circuit; a second adder for subtracting an output of the first adder from a fixed value; and an accumulator for sequentially integrating an output of the second adder.

8 Claims, 14 Drawing Sheets

DIGITAL PHASE DETECTOR AND PHASE-LOCKED LOOP

CLAIM OF PRIORITY

The present application claims priority from Japanese patent application serial no. 2008-131751, filed on May 20, 2008, the content of which is hereby incorporated by reference into this application.

FIELD OF THE INVENTION

The present invention relates to a digital phase detector and a phase-locked loop, and more particularly to a digital phase detector and a phase-locked loop manufactured in a typical CMOS process.

BACKGROUND OF THE INVENTION

An analog controlled phase-locked loop (PLL) circuit detects the phase difference between a reference clock and an output clock of a voltage controlled oscillator (VCO), as the width of the output pulse by a phase comparator. Further, the PLL circuit converts the voltage through a loop filter configured such that the output of the phase comparator has desired PLL characteristics. The PLL circuit applies the converted voltage to a control voltage terminal of the VCO, and controls the frequency of the VCO output clock.

Such an analog controlled PLL circuit requires a resistive element and a capacitive element for the loop filter configured to obtain desired PLL characteristics. However, implementation of these elements in a typical CMOS process is difficult in terms of size and constant accuracy. Thus, the resistive and capacitive elements are often externally mounted through pins of the device. For this reason, miniaturization of the process does not necessarily contribute to miniaturization of the circuit.

Further, when desired PLL characteristics are limited, initial fluctuations of the constants of the externally mounted resistive and capacitive elements as well as temperature changes are a problem. In addition, there is an increased demand for high functionality of the PLL circuit, such as (1) the switching function for switching plural reference clocks input thereto, and (2) the so-called hold-over function for ensuring the output phase of the PLL circuit for a certain period of time when the reference clock is interrupted. As a result, the achievement of desired characteristics is often difficult in the analog controlled PLL circuit.

Thus, in recent years, the analog controlled PLL circuits have been replaced with PLL circuits in which the phase comparator and the loop filter are digitally controlled. The digitally controlled PLL circuit requires a digital phase detector for outputting the phase difference between two clocks, a reference clock and a VCO output clock, as a digital value. The detection accuracy of the phase difference of the digital phase detector is a key factor for the PLL characteristics. It is therefore important to increase the accuracy of the digital phase detector.

To solve this problem, there has been proposed a digital phase detector for quantizing and detecting the phase difference by the delay time of an inverter serving as a delay element, and converts the quantized data to a digital value (see JP-A No. 076886/2002 or JP-A No. 110370/2007).

Now, a conventional digital phase detector will be described with reference to FIGS. 1 and 2. Here, FIG. 1 is a block diagram of a digital phase detector. FIG. 2 is a time chart of the digital phase detector.

In FIG. 1, a digital phase detector 700 includes n inverters 701 serving as delay elements, and n flip flops (hereinafter referred to as F/Fs) 702. A clock CLKi (an input clock signal) is sequentially delayed by n series-connected inverters 701. Outputs D (0) to D(n−1) of the inverters 701 are input to the F/Fs 702, respectively. The F/Fs 702 latch the outputs D(0) to D(n−1) of the inverters 701 by a clock CLKr (a reference clock signal), and output Q (0:n−1), respectively.

The timing of the digital phase detector 700 with n=8, will be described with reference to FIG. 2. In FIG. 2, the abscissa represents the time, and the ordinate represents, from the top to the bottom, (a) CLKi, (b) D (0), (c) D (1), (d) D (2), (e) D (3), (f) D (4), (g) D (5), (h) D (6), (i) D (7), (j) CLKr, (k) Q (0:7). D (0) to D (7) are generated by delaying the clock CLKi by a delay time $\Delta T$ through the inverters 701 serving as delay elements. In the time chart of FIG. 2, D(0) to D(7) are latched at the timing of the rising edge of the clock CLKr to obtain Q (0:7)="11100000".

Because the obtained values vary depending on the phase position of the clock CLKi with respect to the clock CLKr, Q (0:7) obtained as described above shows a digital value indicating the phase difference between the clock CLKr and the clock CLKi. In this way, the digital phase detector 700 can quantize the phase difference between the clock CLKr and the clock CLKi per unit time of the delay time $\Delta T$ of the inverter 701, and convert to a digital value. Further, because the phase difference between the clock CLKr and the clock CLKi is quantized by the delay time $\Delta T$ of the inverter 701, the digital phase detector 700 can detect the phase difference with an accuracy of $\Delta T$.

However, the above described digital phase detector has the following problems.

First, the delay time of the inverter used in the digital phase detector 700 varies depending on the CMOS device implementing the digital phase detector. In other words, the detection accuracy of the phase difference of the digital phase detector is dependent on the CMOS device. For this reason, it is necessary to verify that the desired PLL characteristics can be achieved for each CMOS device implementing the digital phase detector.

Second, the delay time of the inverter 701 used in the digital phase detector 700 varies due to fluctuations in process and changes in source voltage and temperature. As a result, this affects the detection accuracy of the phase difference. For this reason, it is necessary to suppress such fluctuations as much as possible to ensure the desired detection accuracy.

Third, to keep the phase difference detection accuracy to $\Delta T$ in the digital phase detector 700, it is necessary to consider the delay time of the wiring between the inverters 701, and the delay time of the wiring from each inverter 701 to each F/F 702, in addition to the delay time of each of the inverters serving as delay elements. For this reason, both the layout and wiring of the inverters and F/Fs should be fixed.

For application specific standard products (ASSPs), the layout and wiring of inverters and F/Fs can be fixed specific to the desired PLL circuit characteristics and the implementing device. However, it is not efficient for devices that can implement user logic, such as a gate array or field programmable gate array (FPGA), to fix the layout and wiring of the inverters 701 and F/Fs for each user logic design. Basically, products with fixed layout and wiring should be provided by device venders as hard macro. However, the desired PLL circuit characteristics differ depending on the application of each user, so that in general the inverters and F/Fs are not often provided as hard macro.

Thus, it has been difficult to realize the digital phase detector 700 in a device that can implement user logic such as a gate array or FPGA.

SUMMARY OF THE INVENTION

The present invention has been made to solve the above problems, and aims to provide a digital phase detector and PLL that can accurately quantize the phase difference of two clocks and convert to a digital value without using a delay element, and can be easily implemented in a gate array or FPGA, and the like.

The present invention solves the above problems by providing a digital phase detector including: a multiplier that, when a ratio of a frequency of a first clock to a frequency of a second clock is close to an integer K, receives the first clock and multiplies the first clock by M/N, where N is an integer relatively prime to the integer K and M is an integer relatively prime to the integer N; a first flip flop for latching the second clock by an output clock of the multiplier; a counter operated by the output clock of the multiplier; and a logic circuit including plural second flip flops for latching the output of the first flip flop according to an output of the counter.

Further, the present invention solves the above problems by providing a digital phase detector including: a multiplier that, when a ratio of a frequency of a first clock to a frequency of a second clock is close to an integer K, receives the first clock and multiplies the first clock by M/N, where N is an integer relatively prime to the integer K and M is an integer relatively prime to the integer N; a pulse counter for receiving an output clock of the multiplier and the second clock, and counting the number of pulses per cycle of the second clock; a first adder for outputting a difference between an output of the pulse counter and a fixed value; and an accumulator for sequentially integrating an output of the first adder for each cycle of the second clock. The output clock of the multiplier includes L (L is two or larger positive integers) sub clocks phase shifted with respect to each other by equal intervals. The pulse counter includes L flip flops for latching the second clock by the sub clocks, L differential circuits for differentiating outputs of the flip flops, L counters that are initialized by the outputs of the differential circuits to perform a counting operation, L first latch circuits for latching outputs of the counters by the outputs of the differential circuits, L·(N−1) second latch circuits for sequentially latching outputs of the first or second latch circuits by the outputs of the differential circuits, and a second adder for adding the outputs of the L first latch circuits and the outputs of the L·(N−1) second latch circuits.

According to the present invention, when two clocks have frequencies close to an integer ratio, the digital phase detector can accurately quantize the phase difference of the two clocks and convert to a digital value, without using the delay time of an inverter.

BRIEF DESCRIPTION OF THE DRAWINGS

Preferred embodiments of the present invention will now be described in conjunction with the accompanying drawings, in which.

DETAILED DESCRIPTION OF THE PREFERRED EMBODIMENTS

Figure 1:
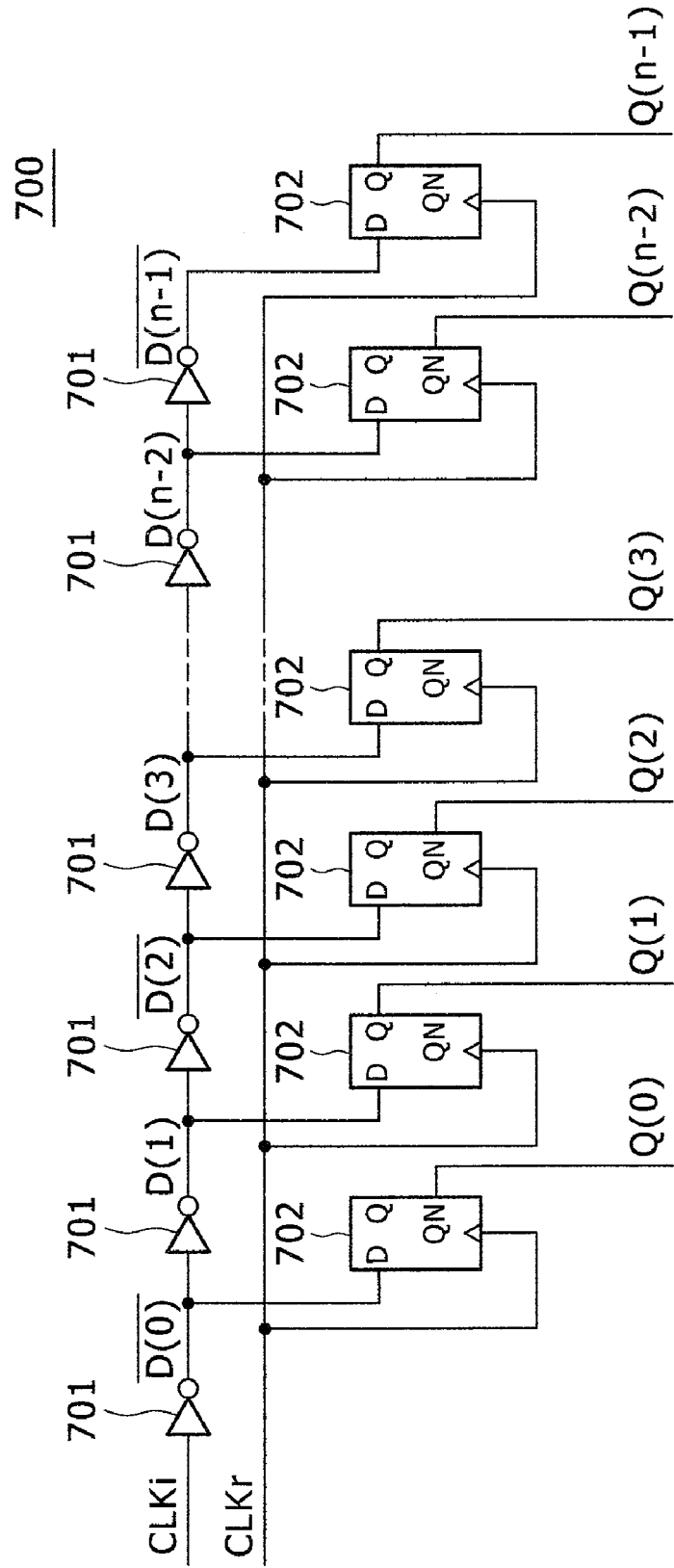
FIG. 1 is a block diagram of a digital phase detector.
Figure 2:
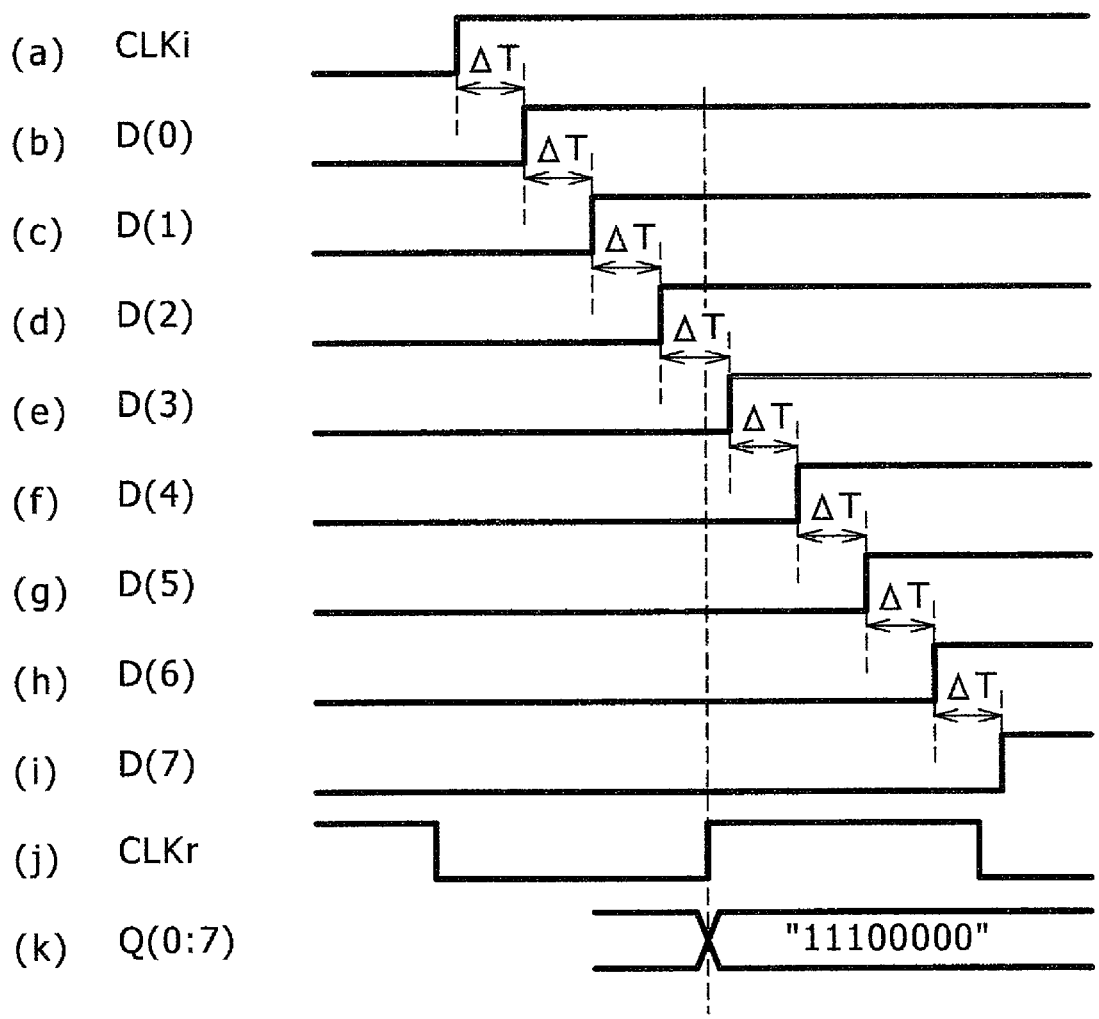
FIG. 2 is a time chart of the digital phase detector.

Hereinafter preferred embodiments will be described with reference to the accompanying drawings, in which corresponding components are identified by the same reference numerals and the description will not be repeated.

First Embodiment

Figure 3:
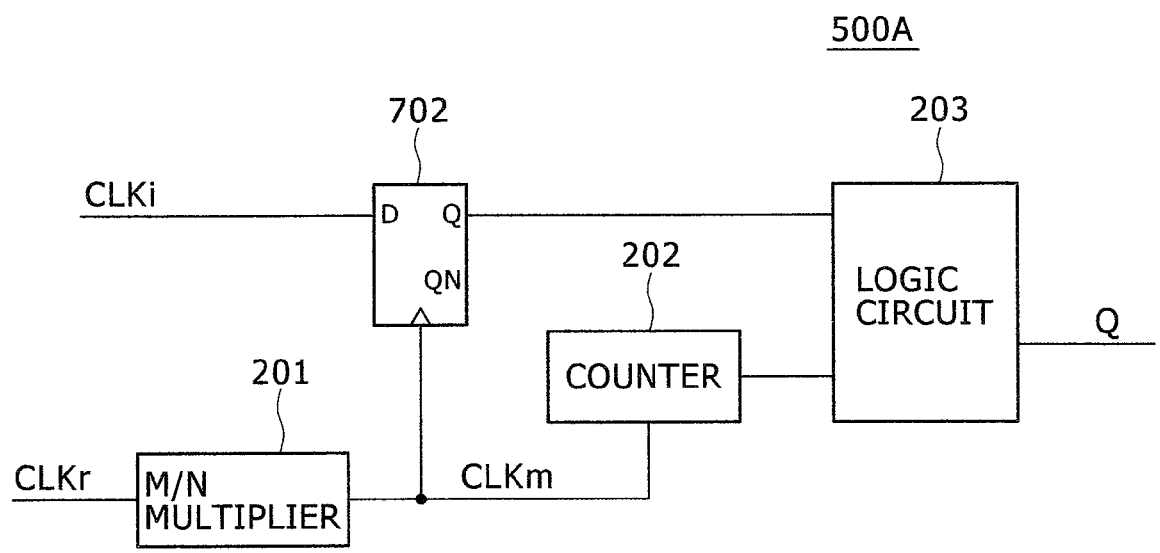
FIG. 3 is a block diagram of a digital phase detector.
Figure 4:
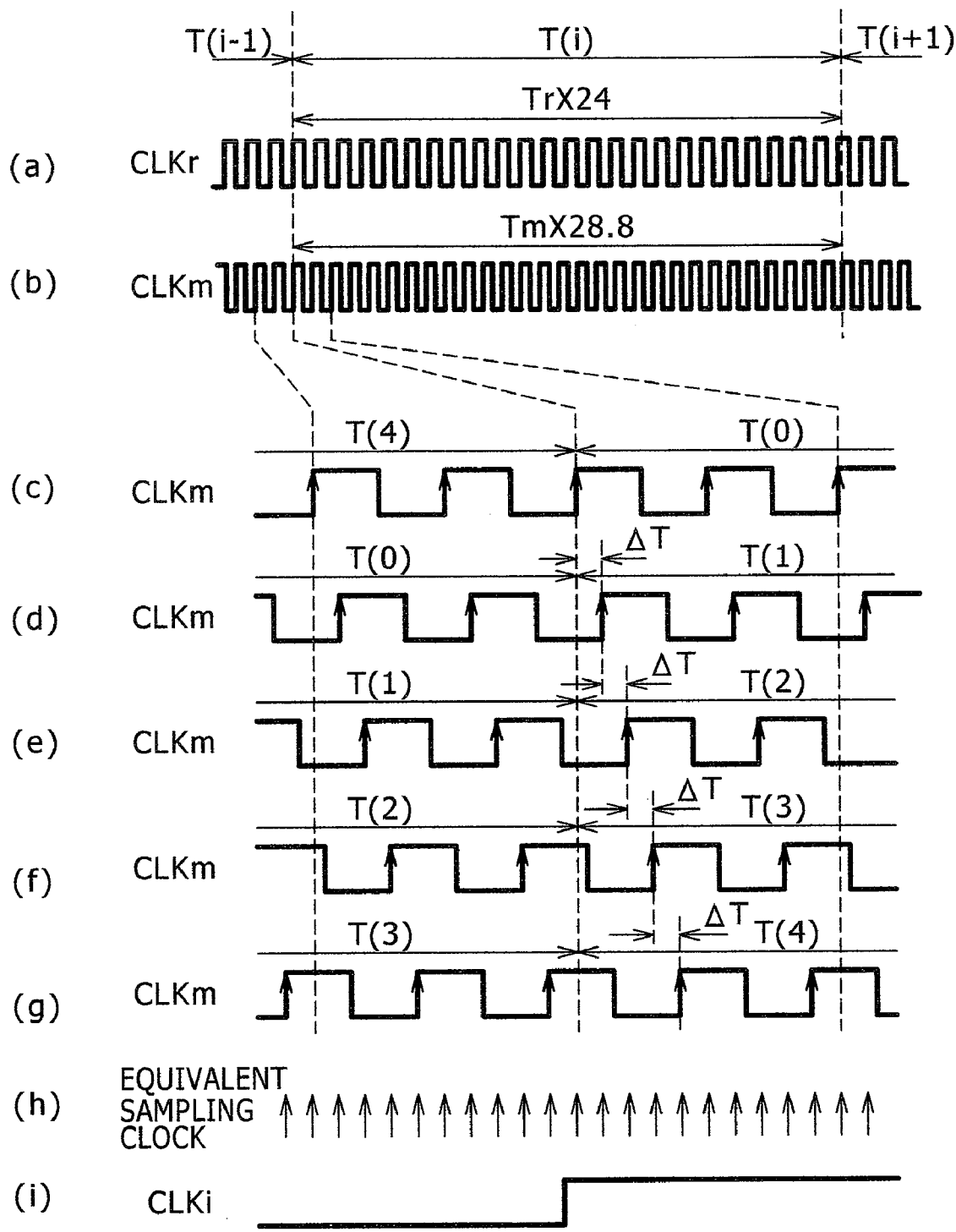
FIG. 4 is a time chart of the digital phase detector.
Figure 5:
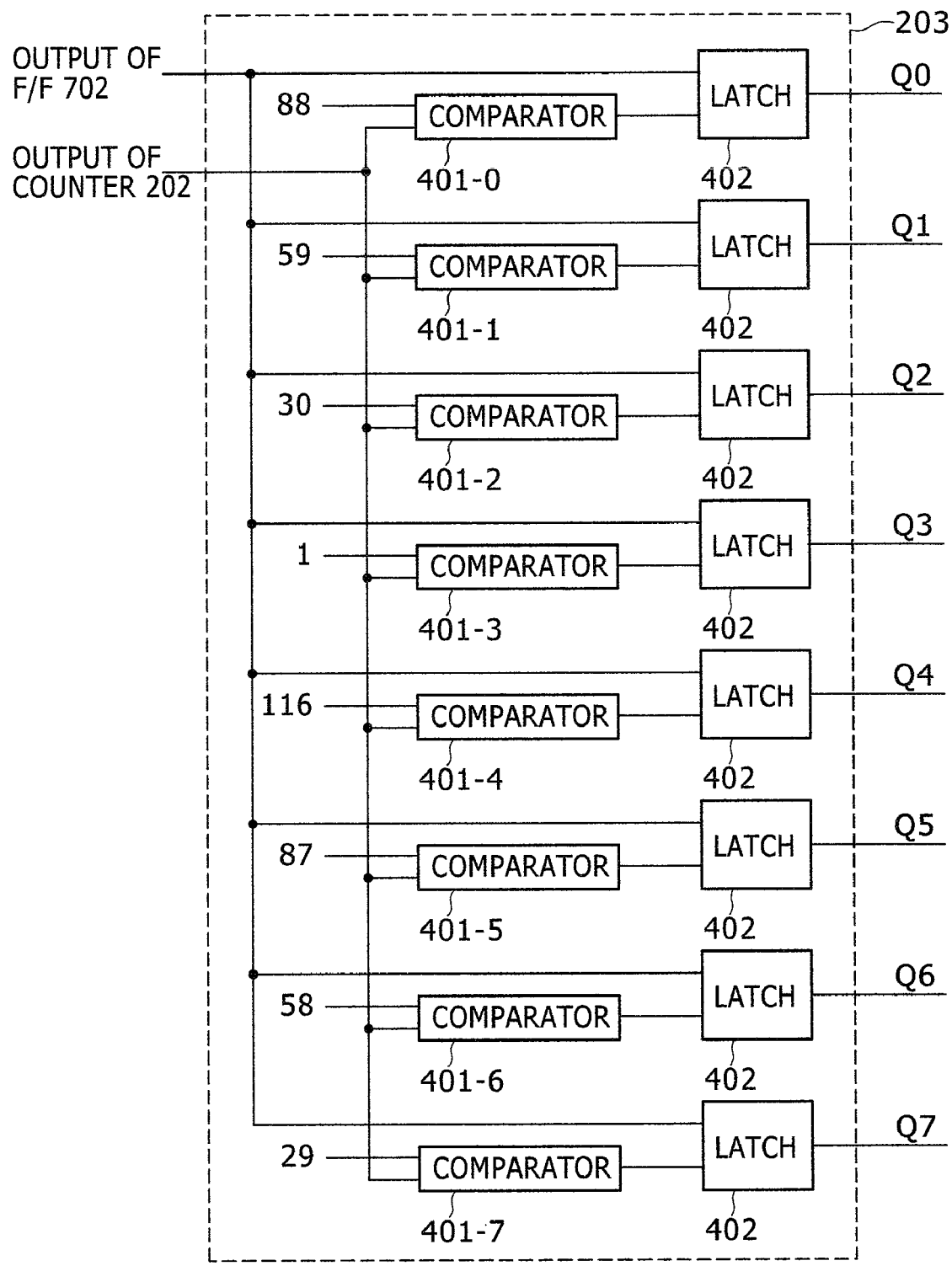
FIG. 5 is a block diagram of a logic circuit.
Figure 6:
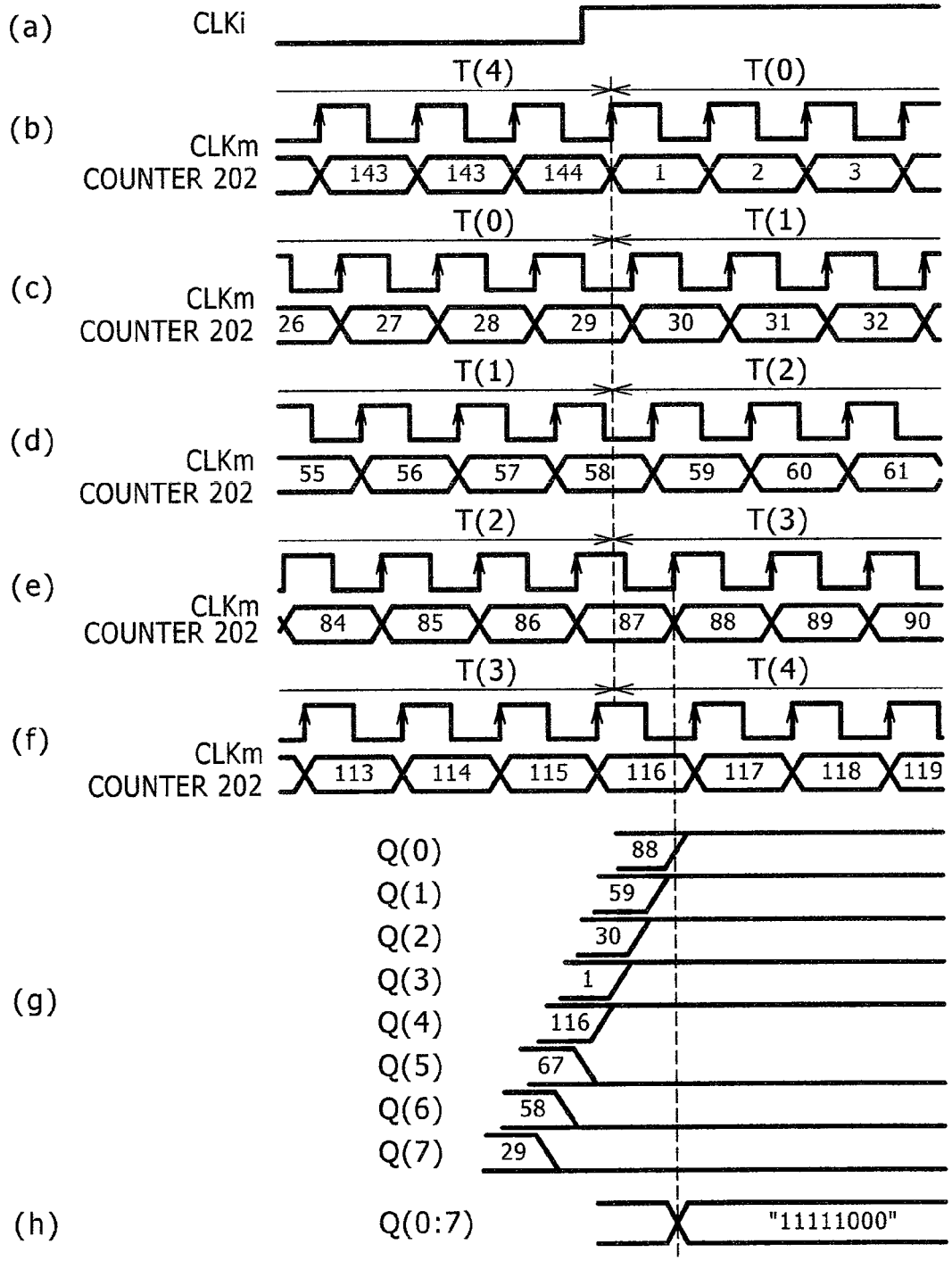
FIG. 6 is a time chart showing the operation of the logic circuit.

A first embodiment will be described with reference to FIGS. 3 to 6. Here, FIG. 3 is a block diagram of a digital phase detector. FIG. 4 is a time chart of the digital phase detector. FIG. 5 is a block diagram of a logic circuit. FIG. 6 is a time chart showing the operation of the logic circuit.

FIG. 3 shows a digital phase detector 500A, in which it is assumed that the ratio of the frequency of a clock CLKr to the frequency of a clock CLKi is close to an integer K. The digital phase detector 500A includes: a multiplier 201 for receiving a first clock CLKr and multiplying the first clock CLKr by M/N, where N is an appropriate integer relatively prime to K and M is an appropriate integer relatively prime to N; a flip flop (hereinafter referred to as F/F) 702 for latching a second clock CLKi by an output clock CLKm of the multiplier 201; a counter 202 operated by the output clock CLKm of the multiplier 201; and a logic circuit 203 for latching a desired output of the F/F 702 according to the output of the counter 202, and outputting the phase difference as a digital value.

Under the above assumptions, the digital phase detector 500A satisfies equation (1), where fr is the frequency of the clock CLKr and fi is the frequency of the clock CLKi.

$$fr \cdot (1-\alpha) \leq K \cdot fi \leq fr \cdot (1+\alpha) \quad (1)$$

where $\alpha \geq 0$

In equation (1), $\alpha$ is the deviation from a frequency equal to the frequency of the clock CLKr divided by K, which is acceptable for the clock CLKi in the digital phase detector. At this time, $\alpha$ is sufficiently small relative to 1. The specific value of $\alpha$ will be described later.

Further, equation (1) is given assuming that the ratio of the frequencies of the two clocks CLKr and CLKi is close to an integer K. However, also when the ratio of the frequencies of the two clocks CLKr and CLKi is close to a rational number K1/K2 (K1 and K2 are integers), namely, when equation (2) is satisfied, fi/K2 is considered to be the clock frequency of CLKi. In other words, equation (2) is equivalent to equation (1), when the frequency of the clock CLKi is divided by K2. Thus, it is possible to configure the digital phase detector also when the ratio of the frequencies of the two clocks CLKr and CLKi is close to a rational number.

$$fr \cdot (1 - \alpha) \leq \frac{K_1}{K_2} \cdot fi \leq fr \cdot (1 + \alpha) \quad (2)$$

Incidentally, the following description will be given assuming that the ratio of the frequencies of the two clocks CLKr and CLKi is close to an integer K.

Next, a description will be given of the phase relationship between the clock CLKr, and the clock CLKm generated by the multiplier 201.

The cycle of the clock CLKr is denoted by Tr, and the cycle of the clock CLKm is denoted by Tm. With the operation of the multiplier 201, the relationship between Tm and Tr is given by equation (3).

$$Tr = Tm \cdot \frac{M}{N} \quad (3)$$

A time period of K times the cycle Tr of the clock CLKr is defined by the unit time T, where T is given by equation (4).

$$T = K \cdot Tr \quad (4)$$
$$= Tm \cdot \left(K \cdot \frac{M}{N}\right)$$

Equation (4) shows that the clock CLKm is counted (K·M/N) times within the unit time T. Here, K, M, N are integers selected in such a way that M is an integer relatively prime to K and N is an integer relatively prime to M. In this case, it is obvious that (K·M/N) is not an integer. Thus, T can be expressed by equation (5).

$$T = Tm \cdot \left(X + \frac{Y}{N}\right) \quad (5)$$

where X is an integer, and Y is an integer of 1 to (N−1).

In equation (5), (Tm·Y/N) shows the time in when a clock edge of the clock CLKm is phase shifted per unit time T with respect to a clock edge of the clock CLKr frequency divided by K. Let the time in which a clock edge of the clock CLKm is phase shifted with respect to a clock edge of the clock CLKr frequency divided by K in an arbitrary time period of the unit time T, be denoted by ΔTmi. Then, ΔTmi can be expressed by equation (6).

$$\Delta Tm_i = Tm \cdot \frac{(i \cdot Y) \bmod N}{N} \quad (6)$$

where modulo N is the residue of a modulo N.

In equation (6), where ΔTmi+N=ΔTmi, the value i that ΔTmi can take can be an integer from 0 to (N−1).

Next, a description will be given of the value that ΔTmi can take, with respect to the cases in which N is a prime number, on the one hand, and N is not a prime number, on the other hand.

When N is a prime number, ((i·Y) modulo N)/N, where Y is an integer of 1 to (N−1), has different values of 0, 1/N, 2/N, . . . , (N−1)/N. The reason is as follows. If i is an integer of 0 to (N−1) and two different i's, for example, i1 and i2, are equal to each other, equation (7) can be derived.

$$\frac{(i_1 \cdot Y) \bmod N}{N} = \frac{(i_2 \cdot Y) \bmod N}{N} \quad (7)$$

Equation (8) is derived by modifying equation (7).

$$(i_1 - i_2) \cdot Y = N \cdot Z \quad (8)$$

where Z is an arbitrary integer.

However, because (i1−i2) is an integer of −(N−1) to (N−1) and Y is an integer of 1 to (N−1), equation (8) can only be derived when i1=i2. In other words, the results of ((i·Y) modulo N)/N differ with different i's. Thus, when N is a prime number, and when i takes N different integers of 0 to (N−1), ΔTmi has N different values: 0, Tm·1/N, Tm·2/N, . . . , Tm·(N−1)/N.

Next, a description will be given of the case when N is not a prime number. When N is not a prime number, ((i·Y) modulo N)/N does not necessarily have N different values. However, for example, in the case of N=9 and Y=1, ((i·Y) modulo N)/N has 9 different values of 0, 1/9, 2/9, . . . , 8/9. Thus, even if N is not a prime number, ΔTmi may have N different values of 0, Tm·1/N, Tm·2/N, . . . , Tm·(N−1)/N, when the integers N and M can be selected as appropriate values.

According to the above description, it is found that the time ΔTmi in which a clock edge of the clock CLKm is phase shifted with respect to a clock edge of the clock CLKr frequency divided by K, has N different values:

0, Tm·1/N, Tm·2/N, . . . , Tm·(N−1)/N, when M and N are integers selected in such a way that M is an appropriate integer, not any integer, which is relatively prime to K, and N is an appropriate integer, not any integer, which is relatively prime to M, and when i takes N different integers of 0 to (N−1). At this time, the time interval of the N different values is equal to ΔT given by equation (9).

$$\Delta T = \frac{Tm}{N} \quad (9)$$

Next, a description will be given of the fact that the phase information of CLKi can be detected with a detection accuracy of ΔT in the configuration shown in FIG. 3.

A certain time period of the unit time T is denoted by T(0), the time period next to T(0) of the unit time T by T(1), and an arbitrary time period of the unit time T by T(i). In N consecutive time periods from T(i) to T(i+N−1), the time in which a clock edge of the clock CLKm is phase shifted with respect to a clock edge of the clock CLKr frequency divided by K, is equal to ΔTmi. When M and N are integers selected in such a way that N is an appropriate integer relatively prime to K and M is an appropriate integer relatively prime to N, the time ΔTmi has N different values with time intervals of ΔT. In other words, the generated clock CLKm has clock edges that are phase shifted with respect to a clock edge of the clock CLKr frequency divided, uniformly by ΔT in N consecutive time periods.

According to the above description, the F/F 702 latches the clock CLKi by the clock CLKm. In this way, the digital phase detector 500A can sample the phase difference between the two clocks uniformly with the detection accuracy of ΔT.

The counter 202 cycles in the range of 1 to (KM) to increment count for each clock edge of the clock CLKm. The logic circuit 203 receives the outputs of both the F/F 702 and the counter 202. Then, the logic circuit 203 refers to the output of the counter 202, and latches and holds the desired one of the outputs of the F/F 702 that are equivalently sampled in N consecutive time periods. The logic circuit 203 rearranges the order of the outputs, and quantizes the information of the phase difference of the clock CLKi by ΔT, with respect to the clock CLKr. Then, the logic circuit 203 outputs the quantized data as a digital value. The configuration of the logic circuit 203 will be described later with reference to FIG. 5.

Next, a description will be given of the range of the deviation α, shown in equation (1), from a frequency equal to the frequency of the clock CLKr divided by K, which is acceptable for the clock CLKi.

In order to detect the phase information of CLKi uniformly with the detection accuracy of ΔT, as described above, it is necessary to have N consecutive time periods of the unit time T, namely, the time of N·Tr·K. For this reason, in the time of N·Tr·K, the phase of the clock CLKi is assumed to be shifted by a value sufficiently smaller than ΔT. Thus, the frequency deviation α, which is acceptable for the clock CLKi, can be expressed by equation (10).

$$-\frac{\Delta T}{2} \ll \alpha \cdot (N \cdot Tr \cdot K) \ll \frac{\Delta T}{2} \quad (10)$$

It is to be noted that in the present specification, the range α satisfying equation (10) is referred to as the frequency close to an integer ratio K.

Next, the configuration of the digital phase detector of FIG. 3 will be described in detail using specific values.

FIG. 4 is a time chart in which K, M, N are integers selected as K=24, N=5, M=6, respectively, in the digital phase detector 500A. In FIG. 4, the abscissa represents the time, and the ordinate represents, from the top to the bottom, (a) CLKr, (b) CLKm, (c) CLKm (0), (d) CLKm (1), (e) CLKm (2), (f) CLKm (3), (g) CLKm (4), (h) equivalent sampling clock, (i) CLKi. Incidentally, as found from the relationship between (b) and (c), (c) to (i) are exploded views for 2 cycles of CLKm before and after the rising edge of CLKi.

As shown in (a) of FIG. 4, the unit time T is Tr·24. Also as shown in (b) of FIG. 4, the unit time T is Tm·28.8 when converted to a cycle Tm of the output clock CLKm of the multiplier 201. Further, in FIG. 4, both the rising edge of the clock CLKr and the rising edge of the output clock CLKm of the multiplier 201 occur at the start of a certain time interval T(0) of the unit time T. In other words, ΔTm0=0 in the figure. At this time, ΔTmi is given by equation (11) using equation (6).

$$\begin{aligned}
\Delta Tm_0 &= 0 \\
\Delta Tm_1 &= Tm \cdot 4/5 \\
\Delta Tm_2 &= Tm \cdot 3/5 \\
\Delta Tm_3 &= Tm \cdot 2/5 \\
\Delta Tm_4 &= Tm \cdot 1/5
\end{aligned} \quad (11)$$

According to (c) to (g) of FIG. 4, it is found that the generated clock CLKm has clock edges that are shifted with respect to each other by ΔT=Tm/5 per unit time T in five consecutive time periods. Thus, when the clock CLKi is sampled with the clock CLKm in the five consecutive time periods from T(0) to T(4), it is possible to detect the phase difference uniformly with the detection accuracy of ΔT.

Referring to FIG. 5, a description will be given of the configuration of the logic circuit of the digital phase detector when K=24, N=5, and M=6 are selected as described above.

In FIG. 5, the logic circuit 203 receives the outputs of both the F/F 702 and the counter 202, and then outputs 8-bit parallel signals. The logic circuit 203 is configured to have eight latch circuits 402 and eight comparators 401. The comparator 401 compares the output of the counter 202 with a fixed value to determine whether the two values are identical. The latch circuit 402 receives the outputs of both the comparator 401 and the F/F 702. When the comparator 401 detects that the output of the counter 202 is identical to the fixed value, the latch circuit 402 latches the output of the F/F 702. In the logic circuit 203, the eight sets of comparators 401 and latch circuits 402 are arranged in parallel, in order to latch the outputs of the F/F 702 when the comparators 401 detect that the outputs of the counter 202 are identical to different fixed values, respectively.

In the logic circuit 203, where K·M=144, the counter 202 cycles in the range of 1 to 144 to increment count for each clock edge of the clock CLKM. Meanwhile, the comparators 401-0 to 401-7 determine whether the outputs of the counter 202 are identical to eight fixed values "88, 59, 30, 1, 116, 87, 58, and 29", respectively. When the outputs are identical to the fixed values, the latch circuits (F/Fs) 402 latch the outputs of the F/F 702, and then outputs the latched data. The basis of the eight fixed values will be described with reference to FIG. 6.

The time chart of the operation of the logic circuit will be described with reference to FIG. 6. In FIG. 6, the abscissa represents the time, and the ordinate represents, from the top to the bottom, (a) CLKi, (b) CLKm (0) and counter, (c) CLKm (1) and counter, (d) CLKm (2) and counter, (e) CLKm (3) and counter, (f) CLKm (4) and counter, (g) Q(0) to Q(7), and (h) Q(0:7). In FIG. 6, the above eight fixed values select the counter values so as to correspond to the continuous eight clock edges shifted with respect to each other by the time interval ΔT in the sampling clock with the uniform time intervals of ΔT. Thus, when an output of the counter 202 is identical to a fixed value, the logic circuit 203 latches the corresponding output of the F/F 702, and then outputs Q(0:7). In the time chart of FIG. 6, Q(0:7)="11111000" is obtained. Because the obtained values vary depending on the phase position of the clock CLKi with respect to the clock CLKr, Q (0:7) obtained as described above shows a digital value indicating the phase difference between the clock CLKr and the clock CLKi. Thus, with the configuration of FIG. 3, it is possible to quantize the phase difference between the clock CLKr and the clock CLKi by a unit time ΔT, and convert to a digital value.

Second Embodiment

Figure 7:
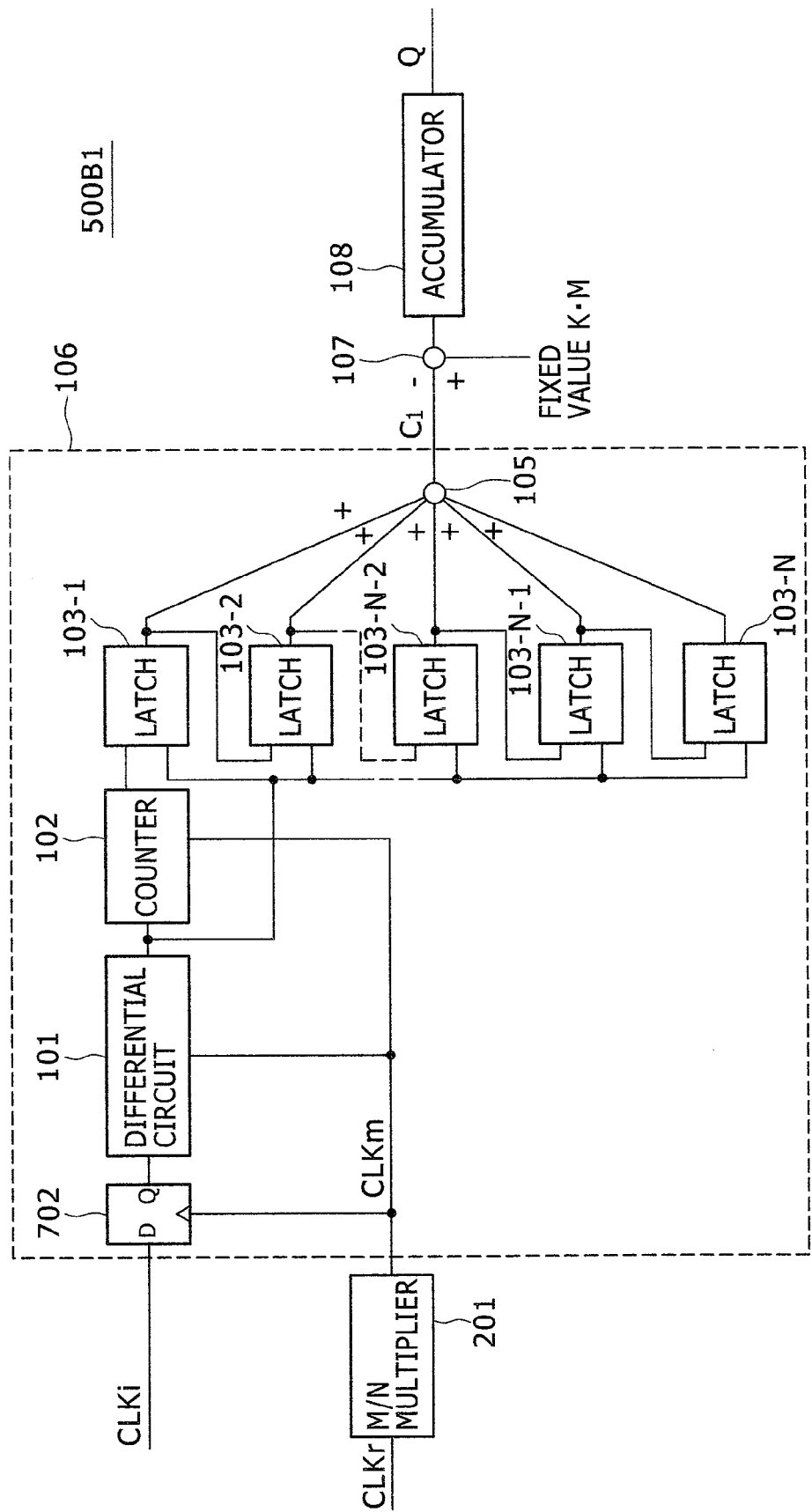
FIG. 7 is a block diagram of another digital phase detector.
Figure 8:
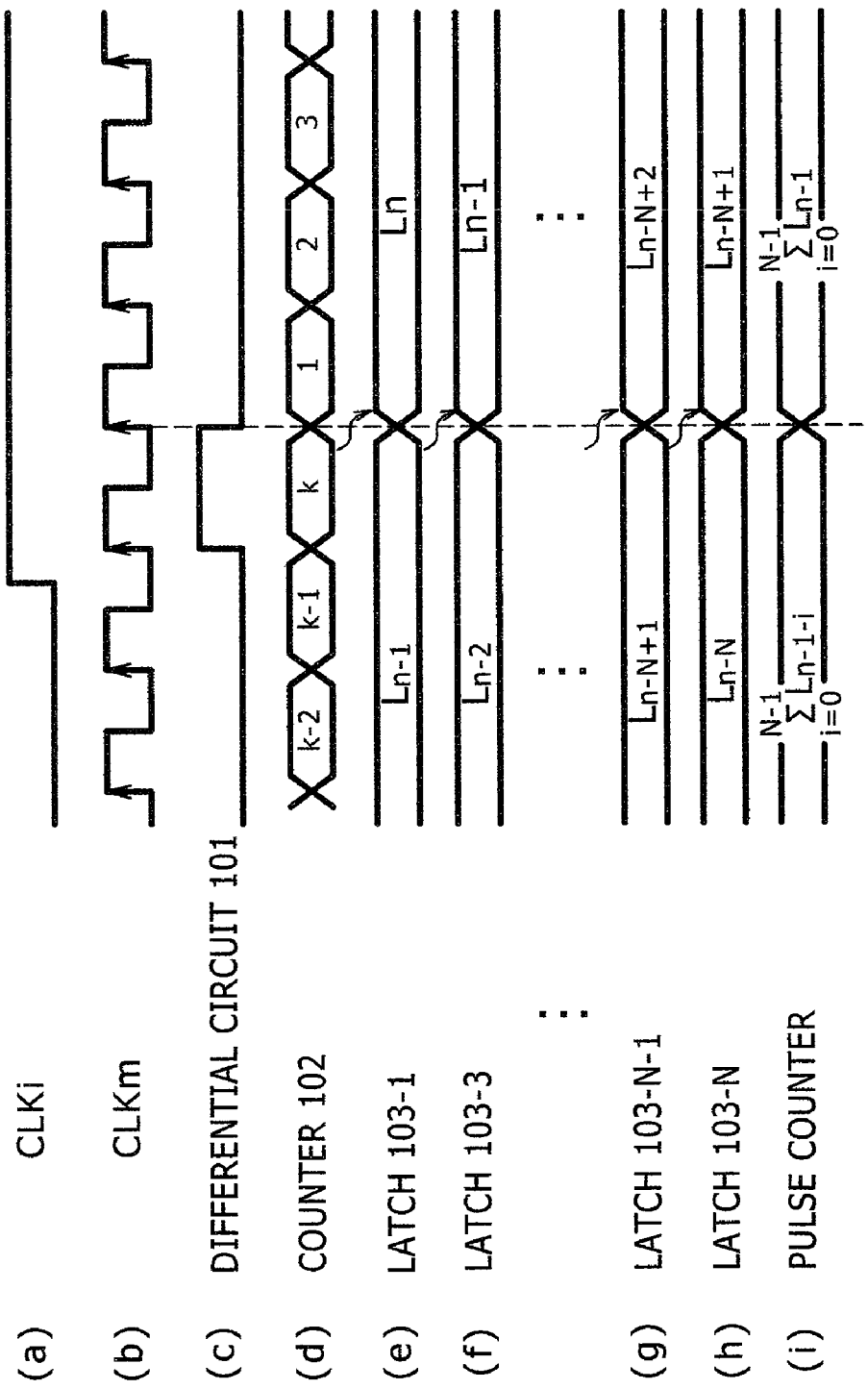
FIG. 8 is a time chart showing the operation of the digital phase detector.
Figure 9:
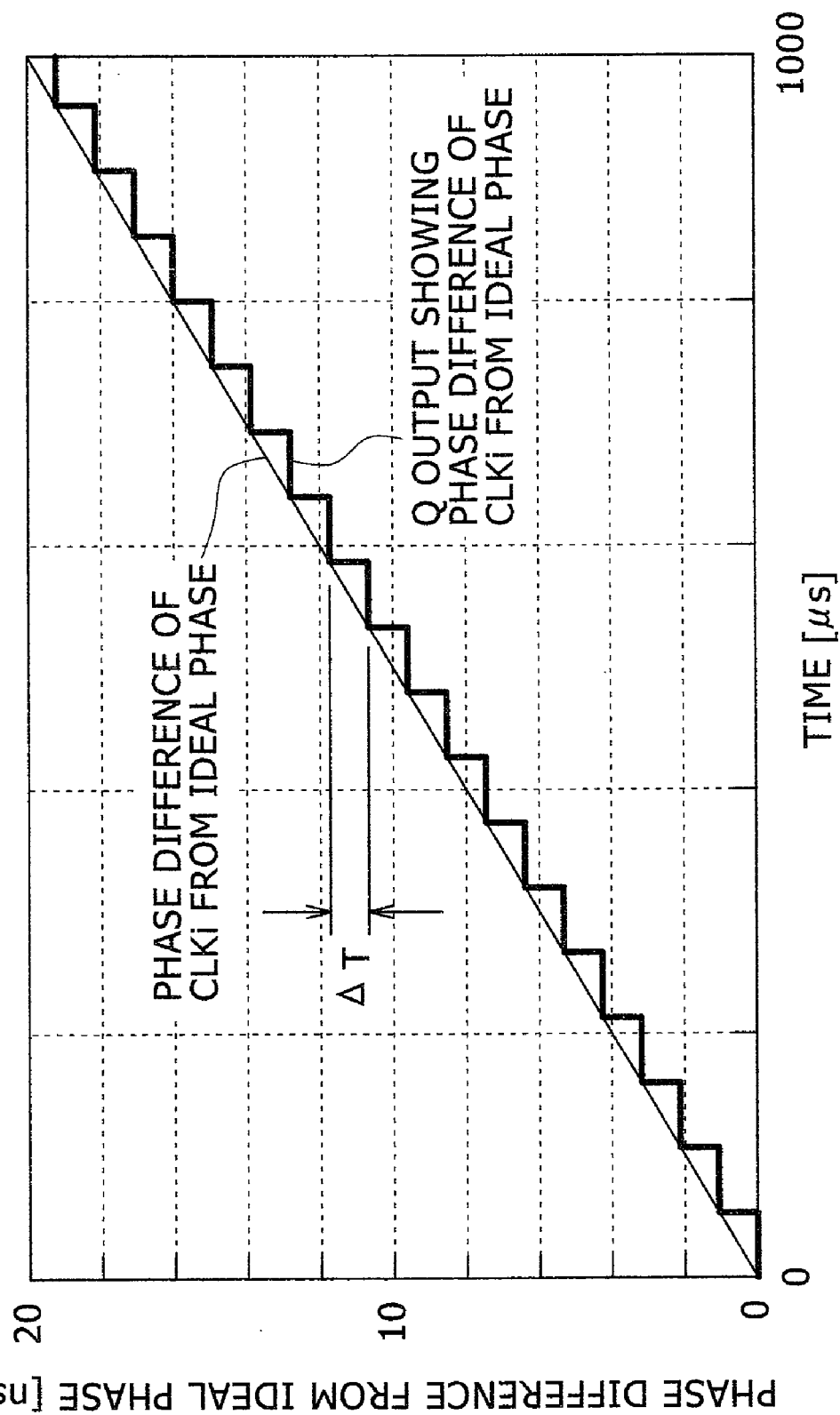
FIG. 9 is a graph showing the effect of the digital phase detector.

A second embodiment will be described with reference to FIGS. 7 to 9. Here, FIG. 7 is a block diagram of another digital phase detector. FIG. 8 is a time chart showing the operation of the digital phase detector. FIG. 9 is a graph showing the effect of the digital phase detector.

In FIG. 7, a digital phase detector 500B1 includes: a multiplier 201 for receiving a first clock CLKr and multiplying the first clock CLKr by M/N, where N is an appropriate integer relatively prime to K and M is an appropriate integer relatively prime to N; a pulse counter 106 for receiving an output clock CLKm of the multiplier 201 and a second clock CLKi, and counting the number of pulses per cycle of the clock CLKi; an adder 107 for outputting the difference between the output of the pulse counter 106 and a fixed value; and an accumulator 108 for sequentially integrating the output of the adder 107 for each cycle of the second clock CLKi.

Further, the pulse counter 106 includes: an F/F 702 for latching the second clock CLKi by an output clock CLKm of the multiplier 201; a differential circuit 101 for differentiating the output of the F/F 702; a counter 102 that is initialized by the output of the differential circuit 101 to perform a counting operation by the output clock CLKm of the multiplier 201; a latch circuit 103-1 for latching the output of the counter 102 by the output of the differential circuit 101; (N−1) latch circuits 103-2 to 103-N for sequentially holding the output of the latch circuit 103-1 by the output of the differential circuit 101; and an adder 105 for adding N outputs of the latch circuits 103.

In the digital phase detector 500B1, by taking advantage of the fact that, as described in the first embodiment, the generated clock CLKm has clock edges that are shifted uniformly by ΔT in N consecutive time periods, the pulse counter 106 counts the cycle Ti of the clock CLKi by the output clock CLKm of the multiplier 201. Then, the pulse counter 106 adds the count results in N consecutive time periods.

The operation of the pulse counter will be described with reference to FIG. 8. In FIG. 8, the abscissa represents the time, and the ordinate represents, from the top to the bottom, (a) CLKi, (b) CLKm, (c) output of the differential circuit 101, (d) counter output, (e) output of the latch 103-1, (f) output of the latch 103-2, (g) output of the latch 103-N−1, (h) output of the latch 103-N, and (i) output of the pulse counter 106.

In FIG. 8, the digital phase detector 500B1 latches the clock CLKi by the output clock CLKm of the M/N multiplier 201. The digital phase detector 500B1 detects the rising edge of the clock CLKi by differentiating the output of the F/F 702 by the differential circuit 101. Then, the digital phase detector 500B1 initializes the counter 102 at the rising edge. The counter 102 counts the number of pulses by the output clock CLKm of the M/N multiplier 201 until the next rising edge of the clock CLKi occurs, namely, during one cycle of the clock CLKi. The counter 102 latches the counted value by the latch circuit 103 at the timing of the next rising edge of the clock CLKi. Each of the N latch circuits 103 holds the pulse number per cycle of the clock CLKi for the past N cycles. The adder 105 sums up the outputs of the latch circuits 103, and outputs the total number of pulses for the past N cycles of the clock CLKi.

With the above operation, it can be considered that the pulse counter 106 samples the cycle of the clock CLKi uniformly at the time interval ΔT, and counts the number of pulses of the sampled cycle. Thus, the output of the pulse counter 106 shows the cycle of the clock CLKi, which is quantized by a unit time ΔT, as a digital value.

Next, a description will be given of the fact that the information of the phase different between the clock CLKi and the clock CLKr can be obtained by the output of the pulse counter 106.

The output of the pulse counter 106 is denoted by C1. The output of the pulse counter 106 shows the cycle of the clock CLKi, which is quantized by the unit time ΔT. Thus, the quantized cycle Tid of the clock CLKi is given by equation (12).

$$Tid = C_1 \cdot \Delta T \qquad (12)$$
$$= C_1 \cdot \frac{Tm}{N}$$

On the other hand, when the frequency of the clock CLKi is equal to the frequency of the clock CLKr frequency divided by K, the cycle of the clock CLKi is given by Tr·K. Based on the case in which the frequency of the clock CLKi is equal to the frequency of the clock CLKr frequency divided by K, the phase shift of the clock CLKi per cycle of the clock CLKi can be given by (Tr·K−Tid). Thus, the phase shift t of the clock CLKi, which is obtained by integrating (Tr·K−Tid) for each cycle of the clock CLKi, is given by equation (13).

$$t = \Sigma(Tr \cdot K - Tid) \qquad (13)$$
$$= \Sigma\left(Tr \cdot K - C_1 \cdot \frac{Tm}{N}\right)$$
$$= \Sigma\left(Tr \cdot \left(K - \frac{C_1}{M}\right)\right)$$

where Σ indicates to integrate for each cycle of the clock CLKi.

When the output Q of the digital phase detector is output as a digital value with ΔT as the unit time, Q is given by equation (14) using equation (13).

$$Q = \frac{t}{\Delta T} \qquad (14)$$
$$= \Sigma(K \cdot M - C_1)$$

The digital phase detector 500B1 of the second embodiment is configured by equation (14). In other words, the adder 107 calculates the difference between the fixed value K·M and the output of the pulse counter 106. The accumulator 108 integrates the output of the adder 107 for each cycle of the clock CLKi. As a result, the digital phase detector 500B1 outputs the phase shift of the clock CLKi as a digital value with ΔT as the unit time.

Incidentally, the digital phase detector 500B1 uses the accumulator 108 to calculate the phase shift of the clock CLKi. When the initial value of the accumulator 108 is 0, and when the phase difference between the clock CLKr and the clock CLKi is 0, the output of the digital phase detector 500B1 shows the phase difference between the clock edge of the clock CLKr and the clock CLKi. However, when the initial value of the accumulator 108 is 0, and when the clock CLKr and the clock CLKi are phase shifted with respect to each other, the output of the digital phase detector 500B1 has a fixed value, as an offset value, which corresponds to the phase difference between the clock edge of the clock CLKr and the clock CLKi when the initial value of the accumulator 108 is 0. Thus, with respect to the phase difference between the clock CLKr and the clock CLKi, when focusing on the relative phase change of the clock CLKi based on the phase of the clock CLKr, the output of the digital phase detector 500B1 can be used as it is. However, when focusing on the absolute value of the phase difference between the clock CLKr and the clock CLKi, the offset value should be subtracted from the output of the digital phase detector 500B1.

The effect of the digital phase detector 500B1 of the second embodiment will be described with reference to FIG. 9. In FIG. 9, the abscissa represents the time (μs), and the ordinate represents the phase difference (ns) from the ideal phase. In FIG. 9, it is assumed that the frequency of the clock CLKr is 155.52 MHz, with K=24, N=5, M=6, and that the frequency of the clock CLKi is 6.48 MHz (=155.52 MHz/24) with a frequency deviation of −20 ppm. The figure shows the phase difference between the clock CLKr and the clock CLKi, which is obtained by multiplying the elapsed time of the output Q by the unit time ΔT. For comparison, the figure also shows the phase difference from the ideal phase of the clock CLKi based on the case in which the frequency of the clock CLKi is 6.48 MHz.

Under the above conditions, the detection accuracy ΔT of the phase difference is 1.08 ns from equation (3). From FIG. 9, it is found that the digital phase detector 500B1 of the second embodiment can accurately detect the phase shift within the detection accuracy of ΔT.

Third Embodiment

Figure 10:
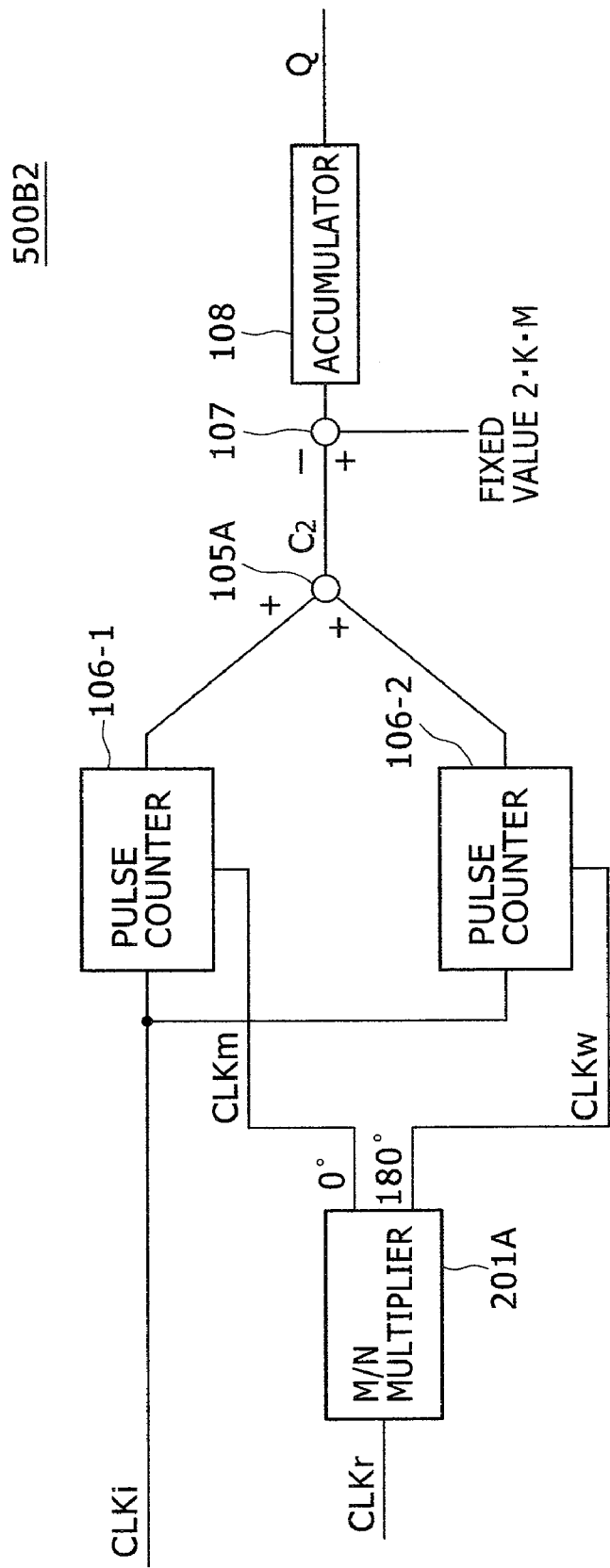
FIG. 10 is a block diagram of another digital phase detector.

A third embodiment will be described with reference to FIG. 10. Here, FIG. 10 is a block diagram of another digital phase detector. In FIG. 10, a digital phase detector 500B2 includes an M/N multiplier 201A, two pulse counters 106, two adders 105A, 107, and an accumulator 108. The M/N multiplier 201A receives a first clock CLKr and multiplies the first clock CLKr by M/N, where N is an appropriate odd number relatively prime to K and M is an appropriate integer relatively prime to N. Then, the M/N multiplier 201A outputs two clocks that are phase shifted with respect to each other by 180 degrees. The two pulse counters 106 receive the two clocks phase shifted with respect to each other by 180 degrees, from the multiplier 201A to count the number of pulses per cycle of a second clock CLKi, respectively. The adder 105A adds the outputs of the two pulse counters 106. The adder 107 outputs the difference between the output of the adder 105A and a fixed value (2·K·M). The accumulator 108 sequentially integrates the output of the adder 107 for each cycle of the second clock CLKi.

Hereinafter the digital phase detector of this embodiment will be described with reference to FIG. 10.

The clock, which is phase shifted with respect to the output clock CLKm of the multiplier by 180 degrees, is denoted by CLKw. The clock CLKw is phase shifted with respect to the clock CLKm by Tm/2. Further, in the above description, the time ΔTmi in which a clock edge of the clock CLKm is phase shifted with respect to a clock edge of the clock CLKr frequency divided by K in an arbitrary time period T(i) of the unit time T. It has been found that the time ΔTmi has N different values:

0, Tm·1/N, Tm·2/N, . . . , Tm·(N−1)/N, when M and N are integers selected in such a way that N is an appropriate integer relatively prime to K and M is an appropriate integer relatively prime to N, and when i takes N different integers of 0 to (N−1).

Thus, the time ΔTwi, in which a clock edge of the clock CLKW is phase shifted with respect to a clock edge of the clock CLKr frequency divided by K in an arbitrary time period T(i) of the unit time T, is given by equation (15).

$$\Delta Tw_i = Tm \cdot \text{Decimal}\left(\frac{i}{N} + \frac{1}{2}\right) \quad (15)$$
$$= Tm \cdot \text{Decimal}\left(\frac{2 \cdot i + N}{2 \cdot N}\right)$$

where Decimal (x) represents the decimal part of x, and i is an integer of 0 to (N−1).

Here, with N=(2·m+1), where N is an odd number and m is an integer, ΔTwi can be expressed by equation (16).

$$\Delta Tw_i = Tm \cdot \text{Decimal}\left(\frac{i+m}{N} + \frac{1}{2 \cdot N}\right) \quad (16)$$
$$= Tm \cdot \left(\frac{(i+m) \text{ modulo } N}{N} + \frac{1}{2 \cdot N}\right)$$

If i takes N different integers of 0 to (N−1), it is obvious that ((i+m) modulo N)/N has N different values:

0, 1/N, 2/N, . . . , (N−1)/N, with respect to an arbitrary integer m. Thus, when M and N are integers selected in such a way that N is an appropriate odd number relatively prime to K and M is an appropriate integer relatively prime to N, and when i takes N different integers of 0 to (N−1), ΔTwi has N different values:

Tm/(2·N),

Tm·1/N+Tm/(2·N),

. . .

Tm·(N−1)/N+Tm/(2·N)

where the time interval is equal to ΔT. Further, N different values of ΔTwi are shifted with respect to N different values of ΔTmi, by Tm/(2·N), namely, by ΔT/2.

Thus, when the two clocks of CLKm and CLKw are used in N consecutive time periods, the times in which clock edges of the two clocks are phase shifted with respect to a clock edge of the clock CLKr frequency divided by K, are 2·N different values with a time interval of ΔT/2. At this time, M and N are integers selected in such a way that N is an appropriate odd number relatively prime to K and M is an appropriate integer relatively prime to N. In other words, clocks are generated that are phase shifted uniformly by ΔT/2 in N consecutive time periods.

In FIG. 10, two pulse counters 106 are provided to count the cycle Ti of the clock CLKi by the two output clocks CLKm and CLKw of the multiplier 201A, respectively, and add the count results obtained in N consecutive time periods, respectively. Further, the adder 105A adds and outputs the outputs of the two pulse counters 106. With the above operation, it can be considered to sample and count the cycle of the clock CLKi at an equal time interval ΔT/2. Thus, the output of the adder 105A shows the cycle of the clock CLKi, which is quantized in a unit time of ΔT/2, as a digital value.

Next, a description will be given of the fact that the information of the phase difference between the clock CLKi and the clock CLKr can be obtained by the output of the adder 105A.

The output of the adder 105A is denoted by C2. The output of the adder 105A shows the cycle of the clock CLKi that is quantized in the unit time ΔT/2. Thus, the quantized cycle Tid of the clock CLKi is given by equation (17).

$$Tid = C_2 \cdot \frac{\Delta T}{2} \quad (17)$$
$$= C_2 \cdot \frac{Tm}{2 \cdot N}$$

On the other hand, when the frequency of the clock CLKi is equal to the frequency of the clock CLKr divided by K, the cycle of the clock CLKi is Tr·K. Based on the case in which the frequency of the clock CLKi is equal to the frequency of the clock CLKr divided by K, the phase shift of the clock CLKi can be given by (Tr·K−Tid) for each cycle of the clock CLKi. Thus, the phase shift t of the clock CLKi, which is obtained by integrating (Tr·K−Tid) for each cycle of the clock CLKi, is given by equation (18).

$$t = \Sigma(Tr \cdot K - Ti d) \qquad (18)$$
$$= \Sigma\left(Tr \cdot K - C_2 \cdot \frac{Tm}{2 \cdot N}\right)$$
$$= \Sigma\left(Tr \cdot \left(K - \frac{C_2}{2 \cdot M}\right)\right)$$

where $\Sigma$ indicates to integrate for each cycle of the clock CLKi.

When the output Q of the digital phase detector is output as a digital value in the unit time $\Delta T/2$, Q is given by equation (19) using equation (18).

$$Q = \frac{t}{(\Delta T/2)} \qquad (19)$$
$$= \Sigma(2 \cdot K \cdot M - C_2)$$

The digital phase detector 500B2 is configured by equation (19). In other words, the adder 107 calculates the difference between the fixed value $2 \cdot K \cdot M$ and the output of the adder 105A. The accumulator 108 integrates the output of the adder 107 for each cycle of the clock CLKi. As a result, the digital phase detector 500B2 outputs the phase shift of the clock CLKi in the unit time $\Delta T/2$, as a digital value.

Fourth Embodiment

Figure 11:
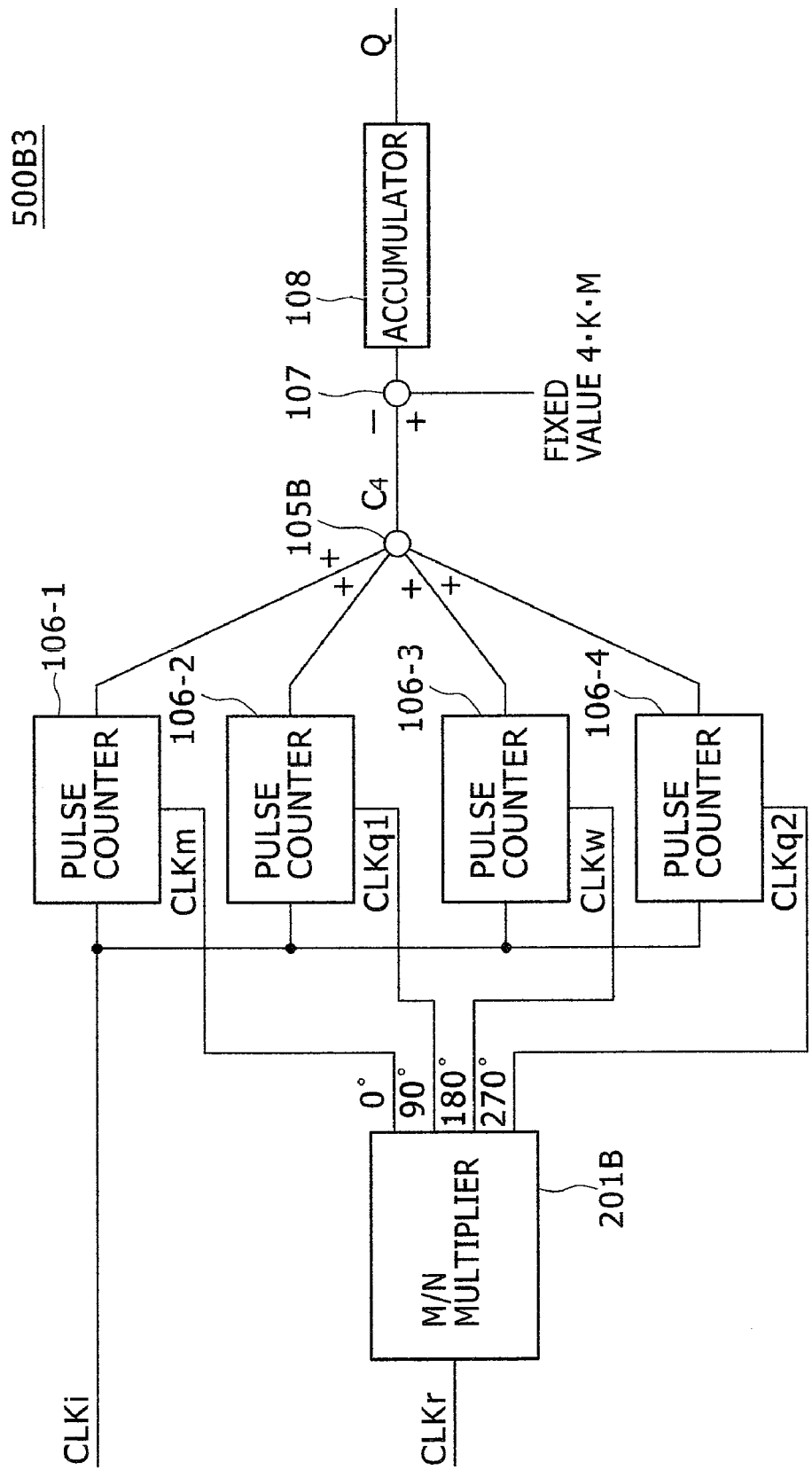
FIG. 11 is a block diagram of still another digital phase detector.

A fourth embodiment will be described with reference to FIG. 11. Here, FIG. 11 is a block diagram of another digital phase detector. In FIG. 11, a digital phase detector 500B3 includes an M/N multiplier 201B, four pulse counters 106, two adders 105B, 107, and an accumulator 108. The M/N multiplier 201B receives a first clock CLKr and multiplies the first clock CLKr by M/N, where N is an appropriate odd number relatively prime to K and M is an appropriate integer relatively prime to N. Then, the M/N multiplier 201B outputs four clocks that are phase shifted with respect to each other by 90 degrees. The four pulse counters 106 receive the four clocks, which are phase shifted with respect to each other by 90 degrees, from the multiplier 201B, to count the number of pulses per cycle of a second clock CLKi, respectively. The adder 105B adds the outputs of the four pulse counters 106. The adder 107 outputs the difference between the output of the adder 105B and a fixed value ($4 \cdot K \cdot M$). The accumulator 108 sequentially integrates the output of the adder 107 for each cycle of the second clock CLKi.

In FIG. 11, a clock phase shifted with respect to the clock CLKm of the multiplier 201B by 90 degrees is denoted by CLKq1. Further, a clock phase shifted with respect to the clock CLKm by 270 degrees is denoted by CLKq2. The clock CLKq1 is phase shifted with respect to the clock CLKm by $Tm \cdot \frac{1}{4}$. The clock CLKq2 is phase shifted with respect to the clock CLKm by $Tm \cdot \frac{3}{4}$. It has been found that the time $\Delta Tmi$, in which a clock edge of the clock CLKm is phase shifted with respect to a clock edge of the clock CLKr frequency divided by K in an arbitrary time period T(i) of the unit time T, has N different values:

0, $Tm \cdot 1/N$, $Tm \cdot 2/N$, ..., $Tm \cdot (N-1)/N$, when M and N are integers selected in such a way that N is an appropriate integer relatively prime to K and M is an appropriate integer relatively prime to N, and when i takes N different integers of 0 to (N−1).

Thus, the time $\Delta Tq1i$ in which a clock edge of the clock CLKq1 is phase shifted with respect to a clock edge of the clock CLKr frequency divided by K, as well as the time $\Delta Tq2i$ in which a clock edge of the clock CLKq2 is phase shifted with respect to a clock edge of the clock CLKr frequency divided by K, are given by equations (20) and (21), respectively.

$$\Delta Tq1_i = Tm \cdot \text{Decimal}\left(\frac{i}{N} + \frac{1}{4}\right) \qquad (20)$$
$$= Tm \cdot \text{Decimal}\left(\frac{4 \cdot i + N}{4 \cdot N}\right)$$

where Decimal (x) represents the decimal part of x, and i is an integer of 0 to (N−1).

$$\Delta Tq2_i = Tm \cdot \text{Decimal}\left(\frac{i}{N} + \frac{3}{4}\right) \qquad (21)$$
$$= Tm \cdot \text{Decimal}\left(\frac{4 \cdot i + 3 \cdot N}{4 \cdot N}\right)$$

where Decimal (x) represents the decimal part of x, and i is an integer of 0 to (N−1).

Here, with N=(4·m+1) or N=(4·m+3), where N is an odd number and m is an integer, $\Delta Tq1i$ and $\Delta Tq2i$ can be expressed by equations (22) and (23), respectively.

$$\Delta Tq1_i = \begin{cases} Tm \cdot \left(\frac{(i+m) \text{ modulo } N}{N} + \frac{1}{4 \cdot N}\right) & (22) \\ \quad \text{where } N = (4 \cdot m + 1) \\ Tm \cdot \left(\frac{(i+m) \text{ modulo } N}{N} + \frac{3}{4 \cdot N}\right) \\ \quad \text{where } N = (4 \cdot m + 3) \end{cases}$$

$$\Delta Tq2_i = \begin{cases} Tm \cdot \left(\frac{(i+3\cdot m) \text{ modulo } N}{N} + \frac{3}{4 \cdot N}\right) & (23) \\ \quad \text{where } N = (4 \cdot m + 1) \\ Tm \cdot \left(\frac{(i+3\cdot m+2) \text{ modulo } N}{N} + \frac{1}{4 \cdot N}\right) \\ \quad \text{where } N = (4 \cdot m + 3) \end{cases}$$

If i takes N different integers of 0 to (N−1), it is obvious that ((i+m) modulo N)/N has N different values:

0, 1/N, 2/N, ..., (N−1)/N, with respect to an arbitrary integer m. Thus, when M and N are integers selected in such a way that N is an appropriate odd number relatively prime to K and M is an appropriate integer relatively prime to N, and when i takes N different integers of 0 to (N−1), one has N different values:

$Tm/(4 \cdot N)$,
$Tm \cdot 1/N + Tm/(4 \cdot N)$
...
$Tm \cdot (N-1)/N + Tm/(4 \cdot N)$ and the other has N different values:

$Tm \cdot 3/(4 \cdot N)$,
$Tm \cdot 1/N + Tm \cdot 3/(4 \cdot N)$
...
$Tm \cdot (N-1)/N + Tm \cdot 3/(4 \cdot N)$.

Further, N different values of $\Delta Tq1i$ and $\Delta Tq2i$ are shifted with respect to N different values of $\Delta Tmi$, by $Tm/(4 \cdot N)$ on the one hand, and by $3 \cdot Tm/(4 \cdot N)$ on the other hand.

Thus, when the four clocks, CLKq1 and CLKq2 in addition to CLKm and CLKw, are used in N consecutive time periods, the times in which clock edges of the four clocks are phase shifted with respect to a clock edge of the clock CLKr frequency divided by K, are 4·N different values with a time interval of ΔT/4. At this time, M and N are integers selected in such a way that N is an appropriate odd number relatively prime to K and M is an appropriate integer relatively prime to N. In other words, clocks are generated that are phase shifted uniformly by ΔT/4 in N consecutive time periods.

The digital phase detector 500B3 takes advantage of the fact that clocks are generated that are phase shifted uniformly by ΔT/4 in N consecutive time periods. The digital phase detector 500B3 counts the cycle Ti of the clock CLKi with the clocks CLKm, CLKw, CLKq1, and CLKq2 output from the multiplier 201B. The digital phase detector 500B3 includes the pulse counters 106 for adding the respective count results in N consecutive time periods. In the digital phase detector 500B3, the adder 105B adds the outputs of the four pulse counters 106, and then outputs the result. It can be considered that the digital phase detector 500B3 samples and counts the cycle of the clock CLKi at an equal time interval ΔT/4. Thus, the output of the adder 105B shows the cycle of the clock CLKi, which is quantized in a unit time of ΔT/4, as a digital value.

Next, a description will be given of the fact that the information of the phase difference between the clock CLKi and the clock CLKr can be obtained by the output of the adder 105B.

The output of the adder 105B is denoted by C4. The output of the adder 105B shows the cycle of the clock CLKi that is quantized in the unit time ΔT/4. Thus, the quantized cycle Tid of the clock CLKi is given by equation (24).

$$Tid = C_4 \cdot \frac{\Delta T}{4} \qquad (24)$$
$$= C_4 \cdot \frac{Tm}{4 \cdot N}$$

Meanwhile, when the frequency of the clock CLKi is equal to the frequency of the clock CLKr divided by K, the number of cycles of the clock CLKi is Tr·K. Based on the case in which the frequency of the CLKr is equal to the frequency of clock CLKr divided by K, the phase shift of the clock CLKi for each cycle of the clock CLKi can be given by (Tr·K−Tid). Thus, the phase shift t of the clock CLKi, which is obtained by integrating (Tr·K−Tid) for each cycle of the clock CLKi, is given by equation (25).

$$t = \Sigma(Tr \cdot K - Tid) \qquad (25)$$
$$= \Sigma \left( Tr \cdot K - C_4 \cdot \frac{Tm}{4 \cdot N} \right)$$
$$= \Sigma \left( Tr \cdot \left( K - \frac{C_4}{4 \cdot M} \right) \right)$$

where Σ indicates to integrate for each cycle of the clock CLKi.

When the digital phase detector outputs the output Q as a digital value in the unit time ΔT/4, Q is given by equation (26).

$$Q = \frac{t}{(\Delta T/4)} \qquad (26)$$
$$= \Sigma(4 \cdot K \cdot M - C_4)$$

The digital phase detector 500B3 is configured by equation (26). In other words, the adder 107 calculates the difference between the fixed value 4·K·M and the output of the adder 105B. The accumulator 108 integrates the output of the adder 107 for each cycle of the clock CLKi. As a result, the digital phase detector 500B3 outputs the phase shift of the clock CLKi in the unit time ΔT/4, as a digital value.

Like the description of the third and fourth embodiments, if more multi-phase clocks can be provided as outputs of the multiplier, the phase detection accuracy of the digital phase detector of the fourth embodiment can be further improved.

The digital phase detectors of the first to fourth embodiments do not use the delay time of an inverter, and can easily be implemented in a CMOS device such as a gate array or FPGA. Thus, the digital phase detectors can be widely applied to various circuits, including not only digital PLL circuit, but also PLL lock detection circuit, phase detection circuit for read and write access to memory, and circuit for monitoring transmission line clocks.

Fifth Embodiment

Figure 12:
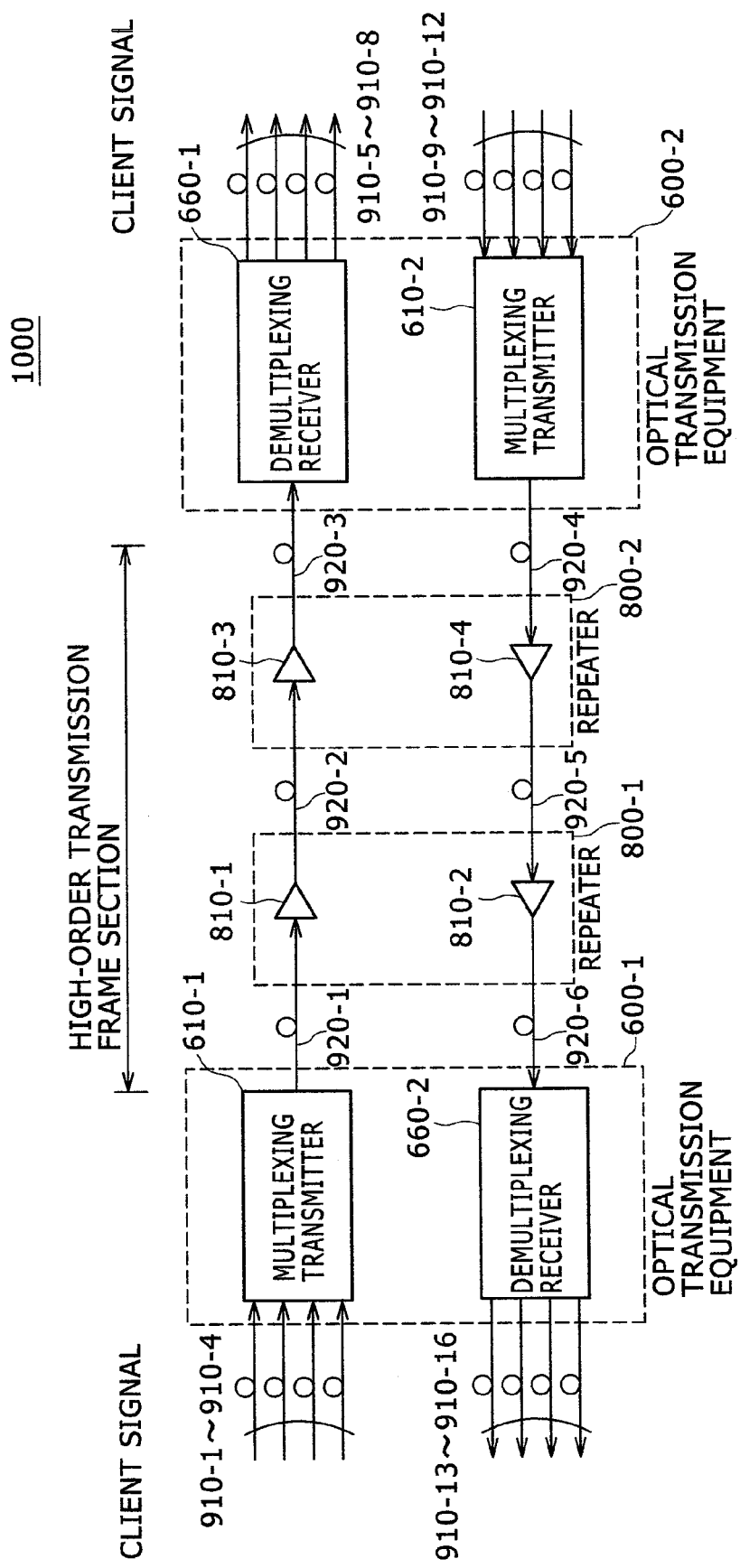
FIG. 12 is a block diagram of an optical transmission system.
Figure 13:
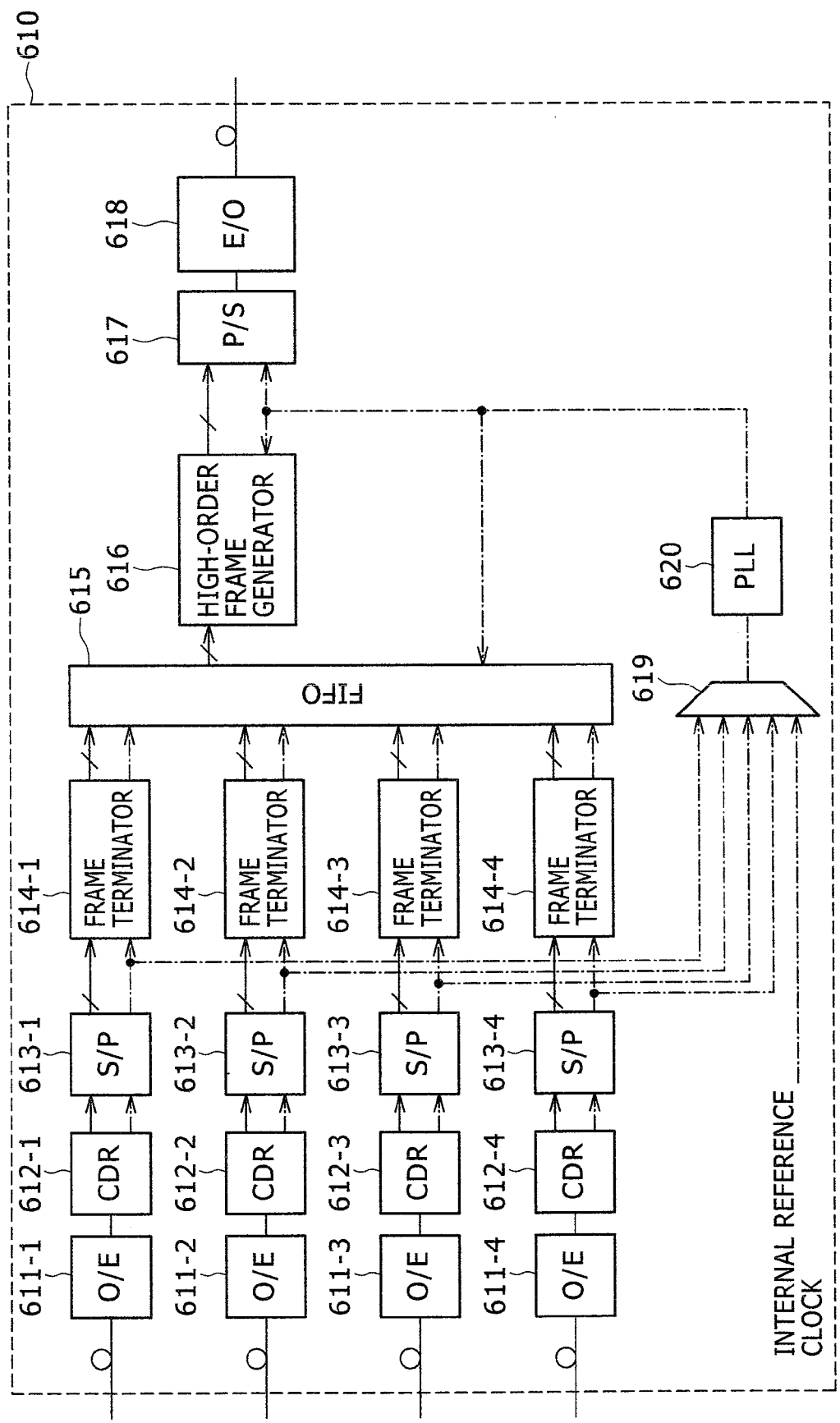
FIG. 13 is a block diagram of an optical multiplexing transmitter.
Figure 14:
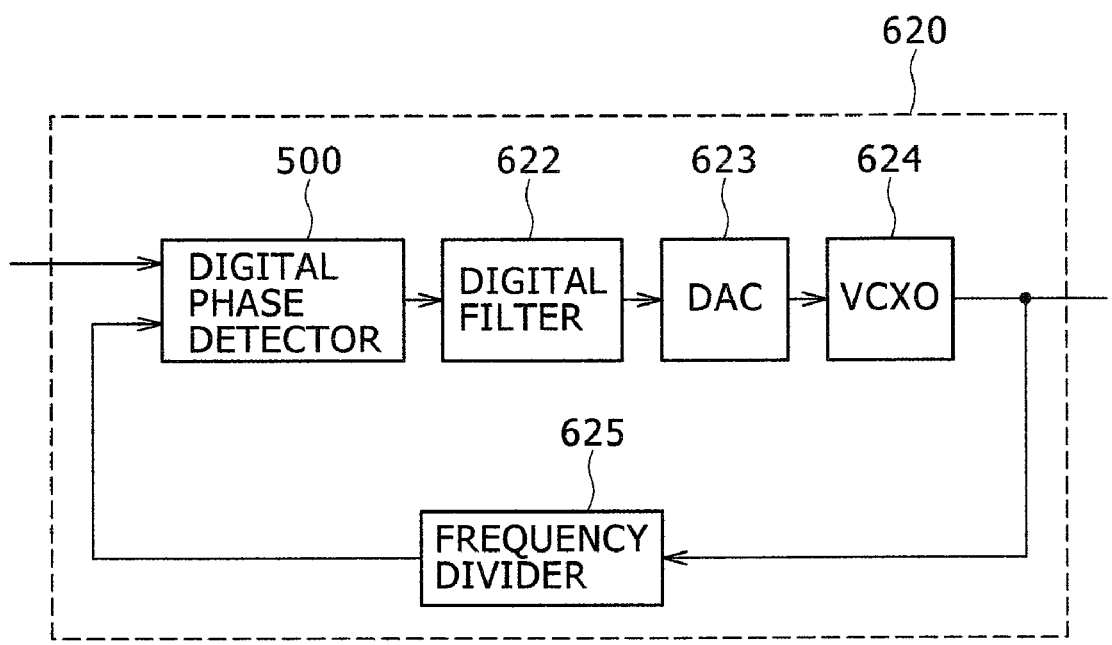
FIG. 14 is a block diagram of a PLL.

A fifth embodiment will be described with reference to FIGS. 12 to 14. Here, FIG. 12 is a block diagram of an optical transmission system. FIG. 13 is a block diagram of an optical multiplexing transmitter. FIG. 14 is a block diagram of a PLL.

In FIG. 12, an optical transmission system 1000 includes two optical transmission equipment 600, two repeaters 800, and optical fibers 920 for connecting the optical transmission equipment 600 and the repeaters 800. The optical transmission equipment 600 are also connected to client devices (not shown) by optical fibers 910. The optical transmission equipment 600 includes a multiplexing transmitter 610 and a demultiplexing receiver 660. The multiplexing transmitter 610 multiplexes plural client signals (four client signals in the figure), and transmits a multiplexed signal to a high-order frame section. The demultiplexing receiver 660 demultiplexes the multiplexed signal transmitted from the high-order frame section, and transmits plural client signals (four client signals in the figure). The repeater 800 includes two optical amplifiers 810 for both directions to amplify the multiplexed signal.

In FIG. 13, the multiplexing transmitter 610 includes, for each of the client signals, O/E converters 611, clock data recovery (CDR) units 612, S/P converters 613, and frame terminators 614. The multiplexing transmitter 610 further includes a first in first out (FIFO) memory 615, a high-order frame generator 616, a P/S converter 617, an E/O converter 618, a clock selector 619, and a PLL 620.

The O/E 611 converts the client signal from an optical signal to an electrical signal. The CDR 612 extracts a clock from the electrical signal to reproduce data. The CDR 612 supplies the extracted clock to the frame terminator 614, the FIFO memory 615, and the clock selector 619. The S/P 613 converts the reproduced serial electrical signal to a parallel electrical signal. The frame terminator 614 terminates the frame of the client signal. The FIFO memory 615 writes the data from the frame terminators 614 by the clocks of each of the client signals, and reads the data to the high-order frame generator 616 by a clock from the PLL. The high-order frame generator 616 generates a high-order frame. The P/S 617 converts the high-order frame from parallel to serial form. The E/O 618 converts the serial electrical signal to an optical electrical signal.

The client signal is STM-16 (2.4 Gbits/s). The high-order frame signal is STM-64 (10 Gbits/s). The four clocks extracted from the client signals, as well as an internal reference clock are input to the clock selector 619 to select a clock source for the high-order frame signal. When the clock selector 619 selects one of the clocks of the client signals, the clock is synchronized with the extracted clock of the line. The PLL 620 generates a reference clock (622.08 MHz or 155.52 MHz) for generating 10 Gbits/s. The PLL 620 also functions as a low pass filter (LPF) for suppressing jitter. The PLL 620 supplies the reference clock to the high-order frame generator 616, the P/S 617, and the FIFO memory 615.

In FIG. 14, the PLL 620 includes a digital phase detector 500, a digital filter 622, a data analog converter (DAC) 623, a voltage controlled crystal oscillator (VCXO) 624, and a frequency divider 625.

The VCXO 624 is a voltage controlled crystal oscillator for changing the oscillation frequency by changing the voltage (analog value) to be applied. The VCXO 624 applies 1.65 V and outputs 155.52 MHz. Meanwhile, the VCXO 624 applies 0 V to output 155.52 MHz-200 ppm, and applies 3.3 V to output 155.52 MHz+200 ppm. As described above, the VCXO 624 changes the oscillation frequency almost proportionally to the applied voltage (an analog value). Incidentally, the oscillation frequency of the VCXO 624 may also be 622.08 MHz±150 ppm, and the like.

The DAC 623 converts the calculation result (digital data) of the digital filter 622 into an analog value to be applied to the VCXO 624. The digital filter 622 receives the output result of the digital phase detector 500, and controls the characteristics of the output so that the PLL 620 can achieve the desired PLL characteristics. The digital filter 622 functions as a low pass filter (LPF) to suppress jitter of the PLL 620. The digital filter 622 determines the transmission characteristics such as cut-off frequency and suppression characteristics of the LPF. However, when the cut-off frequency is reduced more than necessary, although jitter is suppressed, the PLL slows down and does not rapidly follow input changes. As a result, this leads to negative effects of requiring jitter characteristics of the VCXO 624 and reducing the pull-in time. For this reason, the characteristics of the digital filter 622 are adjusted according to the system specifications. The frequency divider 625 divides the frequency of the output clock of the VCXO 624, and feeds back to the digital phase detector 500.

The PLL 620 controls by a feedback loop so that the reference clock and the VCXO output clock are not phase shifted with respect to each other. More specifically, the phase difference between the input clock and the frequency-divided VCXO output clock is detected by the digital phase detector 500. The detection result of the digital phase detector 500 is converted to a voltage by the digital filter 622 and the DAC 623. Then, the voltage is applied to the VCXO 624 to adjust the oscillation frequency of the VCXO 624. As a result, the phase of the VCXO output clock is adjusted.

For the DAC 623, there have been developed circuits that can be easily implemented in FPGA and LSI. Further, there exist digitally controlled on-chip VCOs for the oscillator. Thus, a full digital PLL including the oscillator can be provided by digitally controlling the phase comparator.

According to the fifth embodiment, it is possible to provide a digital PLL that can easily be implemented in a gate array or FPGA, and the like.

What is claimed is:

1. A digital phase detector comprising:
a multiplier that, when a ratio of a frequency of a first clock to a frequency of a second clock is close to an integer K, receives the first clock and multiplies the first clock by M/N, where N is an integer relatively prime to the integer K and M is an integer relatively prime to the integer N;
a first flip flop for latching the second clock by an output clock of the multiplier;
a counter operated by the output clock of the multiplier; and
a logic circuit including a plurality of second flip flops for latching the output of the first flip flop according to an output of the counter.

2. A phase-locked loop comprising:
a digital phase detector, a digital filter, a DA converter, and a voltage controlled crystal oscillator that are series-connected to each other; and
a frequency divider for dividing an output of the voltage controlled crystal oscillator to output the first clock of the digital phase detector,
wherein the digital phase detector is as defined in claim 1.

3. A digital phase detector comprising:
a multiplier that, when a ratio of a frequency of a first clock to a frequency of a second clock is close to an integer K, receives the first clock and multiplies the first clock by M/N, where N is an integer relatively prime to the integer K and M is an integer relatively prime to the integer N;
a pulse counter for receiving an output clock of the multiplier and the second clock, and counting the number of pulses per cycle of the second clock;
a first adder for outputting a difference between an output of the pulse counter and a fixed value; and
an accumulator for sequentially integrating an output of the first adder for each cycle of the second clock,
wherein the pulse counter includes:
a flip flop for latching the second clock by the output clock of the multiplier;
a differential circuit for differentiating an output of the flip flop;
a counter that is initialized by an output of the differential circuit to perform a counting operation;
a first latch circuit for latching an output of the counter by the output of the differential circuit;
(N−1) second latch circuits for sequentially latching an output of the first or second latch circuit by the output of the differential circuit; and
a second adder for adding the outputs of the first and second latch circuits.

4. A digital phase detector comprising:
a multiplier that, when a ratio of a frequency of a first clock to a frequency of a second clock is close to an integer K, receives the first clock and multiplies the first clock by M/N, where N is an integer relatively prime to the integer K and M is an integer relatively prime to the integer N, the multiplier outputting a third clock and a fourth clock that are phase shifted with respect to each other by 180 degrees;
a first pulse counter for inputting the third clock and the second clock and for counting the number of pulses per cycle of the second clock;
a second pulse counter for inputting the fourth clock and the second clock and for counting the number of pulses per cycle of the second clock; and
an adder for adding the outputs of the first and second pulse counters.

5. A phase-locked loop comprising:
a digital phase detector, a digital filter, a DA converter, and a voltage controlled crystal oscillator that are series-connected to each other; and a frequency divider for dividing an output of the voltage controlled crystal oscillator to output the first clock of the digital phase detector, wherein the digital phase detector is as defined in claim 4.

6. A phase-locked loop comprising:

a digital phase detector, a digital filter, a DA converter, and a voltage controlled crystal oscillator that are series-connected to each other; and a frequency divider for dividing an output of the voltage controlled crystal oscillator to output the first clock of the digital phase detector, wherein the digital phase detector is as defined in claim 3.

7. A digital phase detector comprising:

a multiplier that, when a ratio of a frequency of a first clock to a frequency of a second clock is close to an integer K, receives the first clock and multiplies the first clock by M/N, where N is an integer relatively prime to the integer K and M is an integer relatively prime to the integer N;

a pulse counter for receiving an output clock of the multiplier and the second clock, and counting the number of pulses per cycle of the second clock;

a first adder for outputting a difference between an output of the pulse counter and a fixed value; and an accumulator for sequentially integrating an output of the first adder for each cycle of the second clock, wherein the output clock of the multiplier includes L (L is two or larger positive integers) sub clocks phase shifted with respect to each other by equal intervals, wherein the pulse counter includes:

L flip flops for latching the second clock by the sub clocks;

L differential circuits for differentiating outputs of the flip flops;

L counters that are initialized by outputs of the differential circuits to perform a counting operation;

L first latch circuits for latching the outputs of the counters by the outputs of the differential circuits;

L·(N−1) second latch circuits for sequentially latching outputs of the first or second latch circuits by the outputs of the differential circuits;

a second adder for adding the outputs of the L first latch circuits, and the outputs of the L·(N−1) second latch circuits.

8. A phase-locked loop comprising:

a digital phase detector, a digital filter, a DA converter, and a voltage controlled crystal oscillator that are series-connected to each other; and a frequency divider for dividing an output of the voltage controlled crystal oscillator to output the first clock of the digital phase detector, wherein the digital phase detector is as defined in claim 7.

\* \* \* \* \*